United States Patent
Lu et al.

(10) Patent No.: US 6,743,726 B2
(45) Date of Patent: Jun. 1, 2004

(54) METHOD FOR ETCHING A TRENCH THROUGH AN ANTI-REFLECTIVE COATING

(75) Inventors: Jefferson Lu, Hsinchu (TW); Nien-Yu Tsai, Hsinchu (TW)

(73) Assignee: ProMOS Technologies, Inc., Hsinchu (TW)

( * ) Notice: Subject to any disclaimer, the term of this patent is extended or adjusted under 35 U.S.C. 154(b) by 144 days.

(21) Appl. No.: 10/192,154

(22) Filed: Jul. 11, 2002

(65) Prior Publication Data

US 2004/0009672 A1 Jan. 15, 2004

(51) Int. Cl.[7] ............................................. H01L 21/302
(52) U.S. Cl. ................. 438/694; 438/700; 438/706; 438/717; 438/723; 438/724; 438/725
(58) Field of Search ........................... 438/694, 700, 438/706, 717, 723, 724, 725, 736

(56) References Cited

U.S. PATENT DOCUMENTS

| | | | | |
|---|---|---|---|---|
| 6,080,678 A | * | 6/2000 | Yim ............................ | 438/725 |
| 6,194,285 B1 | * | 2/2001 | Lin et al. .................... | 438/424 |
| 6,287,974 B1 | * | 9/2001 | Miller ......................... | 438/706 |
| 6,380,611 B1 | * | 4/2002 | Yin et al. .................... | 257/649 |
| 6,444,588 B1 | * | 9/2002 | Holscher et al. ............ | 438/737 |
| 6,495,450 B1 | * | 12/2002 | Iyer et al. .................... | 438/636 |
| 6,589,879 B2 | * | 7/2003 | Williams et al. ............ | 438/714 |
| 6,602,434 B1 | * | 8/2003 | Hung et al. .................. | 216/39 |

\* cited by examiner

*Primary Examiner*—Nadine G. Norton
*Assistant Examiner*—Binh X. Tran
(74) *Attorney, Agent, or Firm*—Finnegan, Henderson, Farabow, Garrett & Dunner, L.L.P.

(57) ABSTRACT

A method for manufacturing a semiconductor device that includes providing a substrate, providing a dielectric layer over the substrate, depositing a layer of anti-reflective coating over the dielectric layer, providing a layer of photoresist over the layer of anti-reflective coating, patterning and defining the photoresist layer to provide a plurality of photoresist structures, wherein at least two adjacent photoresist structures provide a first distance, anisotropically etching the layer of anti-reflective coating unmasked by the photoresist structures to remove only a portion of the anti-reflective coating layer, etching the anti-reflective coating to completely remove the layer of anti-reflective coating unmasked by the photoresist structures, and etching the dielectric layer to form at least one trench between the at least two adjacent photoresist structures, wherein the first distance is substantially equal to a second distance defining an opening at the top of the trench.

15 Claims, 4 Drawing Sheets

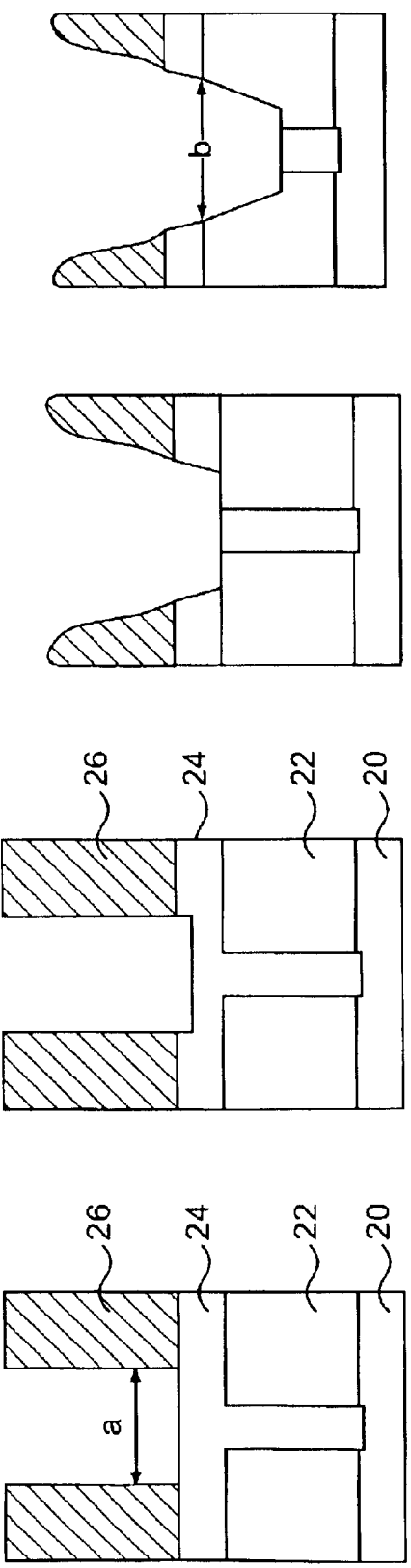

METHOD FOR ETCHING A TRENCH THROUGH AN ANTI-REFLECTIVE COATING

DESCRIPTION OF THE INVENTION

1. Field of the Invention

This invention pertains in general to a method of fabricating a semiconductor device, and, more specifically, to a method of etching metal oxide trenches.

2. Background of the Invention

In modern integrated circuits ("ICs"), reduction of feature sizes is an important consideration in lowering manufacturing costs. Photolithography is a pattern transfer technology using a light-sensitive photoresist material and controlled exposure to light. A photoresist is initially applied as a thin film to a silicon substrate and the photoresist is exposed to light through a mask to pattern the photoresist. Photolithography has been a major limiting factor in the continued reduction of feature sizes. One of the feature sizes that must be controlled in the lithographic process is the absolute size of contact dimensions which is referred to as critical dimension ("CD").

During the photolithographic process, light passes through the photoresist film down to the semiconductor substrate, where it is reflected back up through the photoresist. The reflected light could damage the adjacent photoresist, adversely affecting the control of CD. In general, there are two types of light reflectivity problems: reflective notching and standing waves.

It is known that using an anti-reflection coating ("ARC") can minimize reflective notching and CD variations caused by standing wave effects. A more common way is the application of an ARC to the wafer surface before the photoresist is applied. The ARC material is capable of suppressing unintended light reflection from a reflective substrate that is beneath the photoresist.

In a general CMOS process flow, photolithography is followed by an etch process. The basic purpose of etching is to precisely replicate the desired pattern on the wafer surface. Referring to FIG. 1a, an ARC layer 102 is provided over a layer 100 that is the subject of the subsequent etching process. A photoresist 104 is provided over the ARC layer 102 and has been defined and developed, wherein the distance "A" represents the specified CD for this particular step of the semiconductor manufacturing process.

When an ARC is provided in a manufacturing process, the subsequent etching process must take into account the ARC layer, which may be difficult because the ARC thickness is usually non-uniform. In conventional processes, an etchant with high selectivity has been employed to etch the ARC layer with minimal unintended etching on the dielectric layer provided over the silicon wafer, in the case of a bottom ARC layer ("BARC"). The etching process continues to etch the dielectric layer down to a target depth to form trenches.

Although use of the etching material having high ARC to underlying layer etching selectivity is able to overcome the ARC thickness variation issue, an unintended result is that the photoresist exhibits a sharp profile with the space separating adjacent photoresist sections at the top being much wider than at the bottom as shown in FIG. 1b. Consequently, the CD actually etched is much larger than intended and becomes unpredictable as shown in FIG. 1c, wherein the distance "C" represents the actual dimension obtained, and wherein "C" is greater than "A". Such CD instability often signifies instability in a critical part of the semiconductor manufacturing process, and poor CD control results in undesirable decreases in the yield of the manufacturing process.

SUMMARY OF THE INVENTION

In accordance with the invention, there is provided a method for manufacturing a semiconductor device that includes providing a substrate, providing a dielectric layer over the substrate, depositing a layer of anti-reflective coating over the dielectric layer, providing a layer of photoresist over the layer of anti-reflective coating, patterning and defining the photoresist layer to provide a plurality of photoresist structures, wherein at least two adjacent photoresist structures provide a first distance, anisotropically etching the layer of anti-reflective coating unmasked by the photoresist structures to remove only a portion of the anti-reflective coating layer, etching the anti-reflective coating to completely remove the layer of anti-reflective coating unmasked by the photoresist structures, and etching the dielectric layer to form at least one trench between the at least two adjacent photoresist structures, wherein the first distance is substantially equal to a second distance defining an opening at the top of the trench.

Also in accordance with the present invention, there is provided a method for forming a shallow trench isolation that includes providing a semiconductor wafer, providing a dielectric layer over the wafer, depositing an anti-reflective coating layer over the dielectric layer, providing a plurality of photoresist structures, wherein at least two adjacent photoresist structures provide a first distance, etching the anti-reflective coating layer unmasked by the photoresist structures to remove less than the entire thickness of the anti-reflective coating layer, further etching the anti-reflective coating with nitrogen and hydrogen etchants to remove only the anti-reflective coating unmasked by the photoresist structures, and etching the dielectric layer to form at least one trench between the at least two adjacent photoresist structures, wherein the first distance is substantially the same as a second distance defining an opening at the top of the trench.

In accordance with the present invention, there is additionally provided a method of etching anti-reflective coatings in a semiconductor device that includes providing a dielectric layer, forming a plurality of vias in the dielectric layer, depositing a layer of anti-reflective coating over the dielectric layer and in the plurality of vias, providing a layer of photoresist over the layer of anti-reflective coating, patterning and defining the photoresist layer to provide a plurality of photoresist structures, wherein at least two adjacent photoresist structures provide a first distance, anisotropically etching the layer of anti-reflective coating unmasked by the photoresist structures to remove only a portion of the anti-reflective coating layer, providing an etching having high etching selectivity between the anti-reflective coating layer and the dielectric layer to remove only the layer of anti-reflective coating unmasked by the photoresist structures, and etching the dielectric layer and at least one of the plurality of vias provided with the anti-reflective coating to form at least one trench between the at least two adjacent photoresist structures, wherein the first distance is substantially equal to a second distance defining an opening at the top of the trench.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

BRIEF DESCRIPTION OF THE DRAWINGS

FIGS. 3a–3d are cross-sectional views of the fabrication steps consistent with another embodiment of the present invention.

DESCRIPTION OF THE EMBODIMENTS

Reference will now be made in detail to the present embodiment of the invention, an example of which is illustrated in the accompanying drawings. Wherever possible, the same reference numbers will be used throughout the drawings to refer to the same or like parts.

Figure 1A:
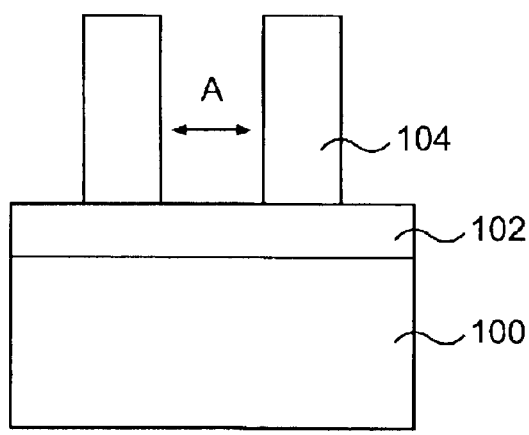
FIGS. 1a–1c are cross-sectional views of a conventional semiconductor manufacturing process.
Figure 1B:
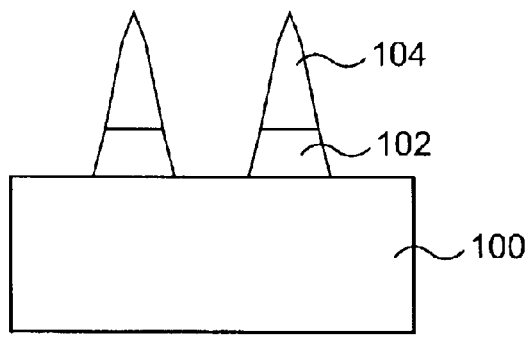
Figure 1C:
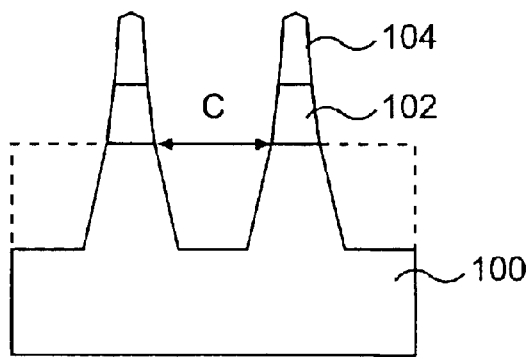
Figure 2A:
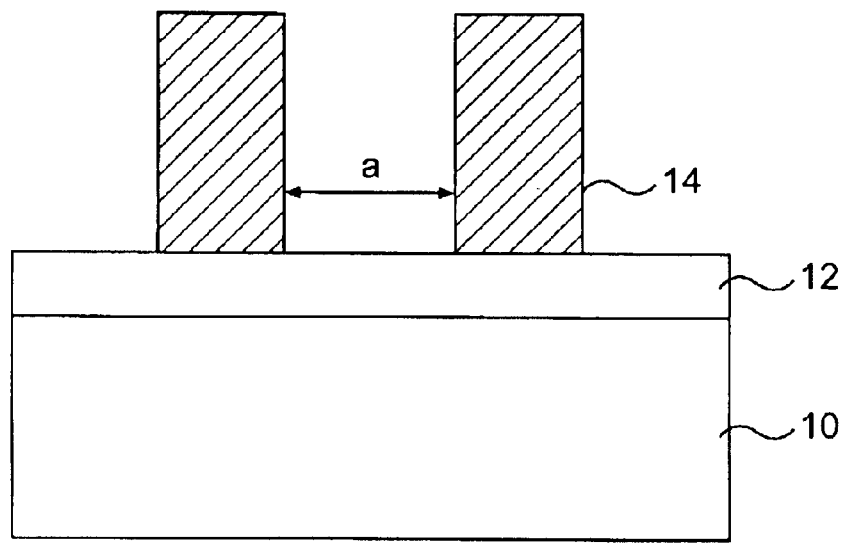
FIGS. 2a–2d are cross-sectional views of the fabrication steps consistent with one embodiment of the present invention.

The present invention provides a two-step etching process to minimize CD instability, and may be used for the formation of shallow trench isolation structures or dual damascene structures. Referring to FIG. 2a, an embodiment of the method of the present invention begins with defining a wafer substrate (not shown). The wafer substrate may be of any known semiconductor substrate material, such as silicon. A layer of dielectric material 10 is then grown or deposited over the wafer substrate. The dielectric layer 10 may be composed of silicon dioxide ($SiO_2$), silicon nitride ($Si_3N_4$), silicon oxynitride ($SiO_xN_y$), or a combination thereof to form a multi-layer stacked film, such as a silicon dioxide (or pad oxide) and silicon nitride.

An ARC layer 12 is deposited over the dielectric layer 10. The ARC layer 12 functions to decrease light reflection from the dielectric layer 10 during the subsequent manufacturing steps. A photoresist layer 14 is then provided over the ARC layer 12. The photoresist layer 14 is patterned and defined using a conventional photolithographic process to form a patterned and defined photoresist layer having a plurality of photoresist structures 14. The distance "a" separating the photoresist structures 14 is the lithographic CD.

Figure 2B:
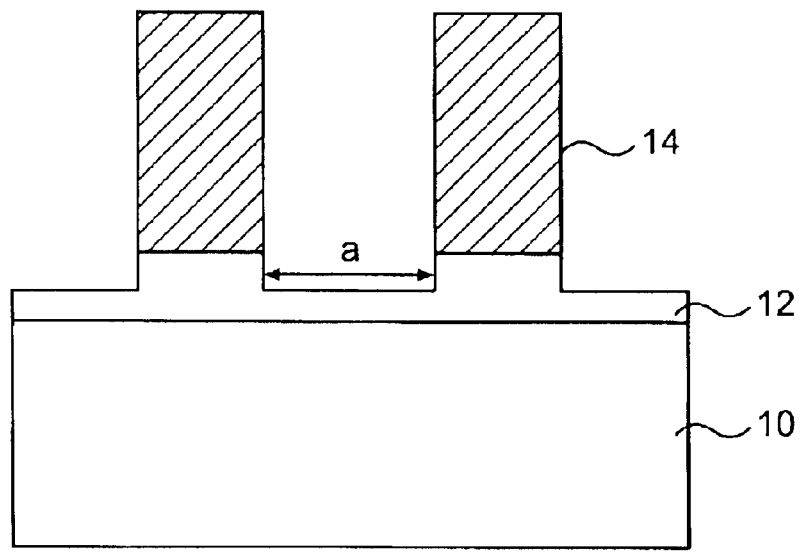

A two-step etching then follows. Referring to FIG. 2b, anisotropic etching, such as reactive ion etch ("RIE"), is then performed on the ARC layer 12 to remove portions of the ARC layer 12. The characteristics of anisotropic etching enable portions of the ARC layer 12 to remain over the dielectric layer 10, and maintain substantially vertical sidewalls on the photoresist structures 14. In one embodiment, the pressure applied in the RIE process is in the range of approximately 20 mTorr to 130 mTorr. The bias power ranges from approximately 500 watts to 1200 watts. The temperature of the RIE process is less than about 35° C. The reactive gases used are fluorocarbons. In one embodiment, the gas is chosen from a mixture of tetrafluoromethane ($CF_4$) and trifluoromethane ($CHF_3$).

Figure 2C:
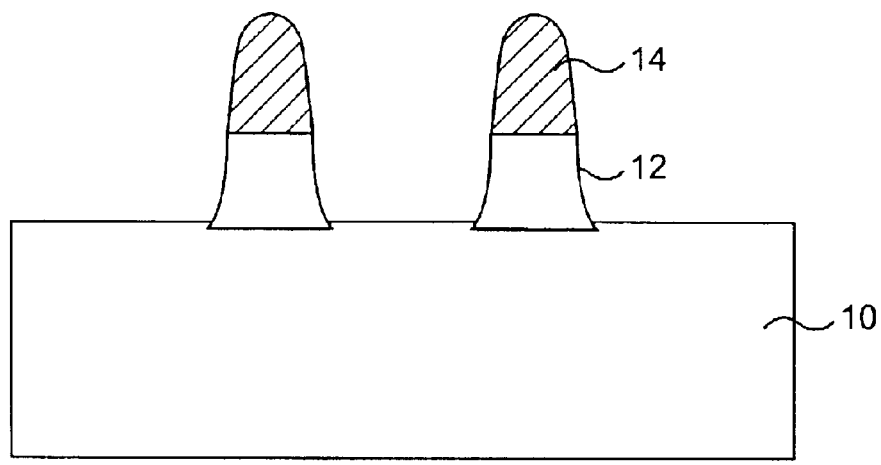

Referring to FIG. 2c, another etching step follows to remove the remaining exposed portions of the ARC layer 12. A mixture of hydrogen and nitrogen gases may be used as etchants. These etchants have high etching selective between the ARC layer 12 and dielectric layer 10 so that the dielectric layer 10 is not etched during this process. The high etching selectivity of these etchants avoids the disadvantages of the prior art due to the non-uniformity of the ARC layer 12.

Figure 2D:
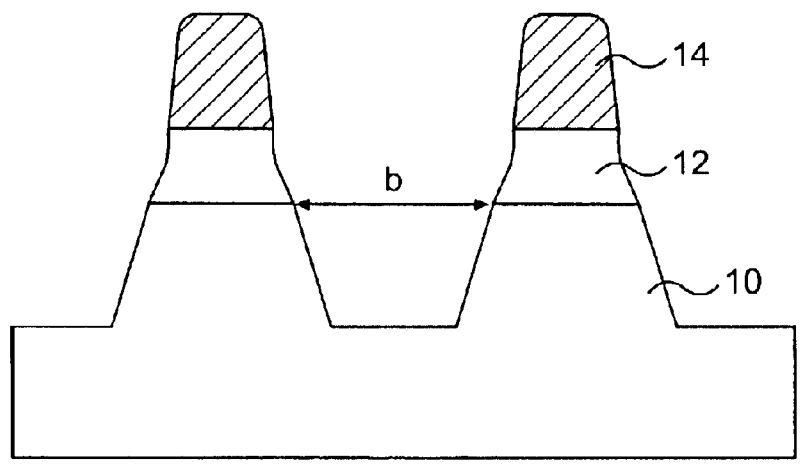

Referring to FIG. 2d, a plurality of trenches (not numbered) are formed at the target depth with additional conventional etching steps. In the present invention, the CD of the trenches, labeled as "b", is substantially identical to the lithographic CD "a". A typical mixture of etchants includes $CF_4$, $CHF_3$, and argon (Ar) gas. Conventional steps then follow to form shallow trenches (not shown) in the wafer substrate and fill the shallow trenches with dielectric materials to form shallow trench isolations.

The method of the present invention may also be used in the manufacture of dual damascene structures. Referring to FIG. 3a, a first layer 20 is first defined. The first layer 20 may be a wafer substrate. A layer of dielectric material 22 is then grown or deposited over the first layer 20. The dielectric layer 22 may be composed of silicon dioxide ($SiO_2$), silicon nitride ($Si_3N_4$), and silicon oxynitride ($SiO_xN_y$), or multi-layer stacked films. Conventional masking and etching steps follow to form vias (not numbered) in the dielectric layer 22.

An ARC layer 24 is deposited over the dielectric layer 22 and in the vias. The ARC layer 24 functions to decrease light reflection from the dielectric layer 22 during the subsequent manufacturing steps. A photoresist layer 26 is provided over the ARC layer 24. The photoresist layer 26 is patterned and defined using a conventional photolithographic process to form a patterned and defined photoresist layer having a plurality of photoresist structures 26. The distance "a" separating the photoresist structures 26 is the lithographic CD.

Referring to FIG. 3b, anisotropic etching, such as reactive ion etch ("RIE"), is then performed on the ARC layer 24 to remove portions of the ARC layer 24. The characteristics of anisotropic etching enable portions of the ARC layer 24 to remain over the dielectric layer 22, and maintain substantially vertical sidewalls on the photoresist structures 26. In one embodiment, the pressure applied in the RIE process is in the range of approximately 20 mTorr to 130 mTorr. The bias power ranges from approximately 500 watts to 1200 watts. The temperature of the RIE process is less than about 35° C. The reactive gases used are fluorocarbons. In one embodiment, the gas is chosen from a mixture of tetrafluoromethane ($CF_4$) and trifluoromethane ($CHF_3$).

Referring to FIG. 3c, a second etching step follows to remove the remaining exposed portions of the ARC layer 24. A mixture of hydrogen and nitrogen gases may be used as etchants. These etchants have high etching selective between the ARC layer 24 and dielectric layer 22 so that the dielectric layer 22 is not etched during this process. The high etching selectivity of these etchants avoids the disadvantages of the prior art due to the non-uniformity of the ARC layer 24.

Referring to FIG. 3d, the dielectric layer 22 is etched, together with a portion of the ARC layer 24 provided inside the vias, to form a plurality of trenches (only one is shown) with additional conventional etching steps. In the present invention, the CD of the trenches, labeled as "b", is substantially identical to the lithographic CD "a". A typical mixture of etchants includes $CF_4$, $CHF_3$, and argon (Ar) gas.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a semiconductor device, comprising:

providing a substrate;

providing a dielectric layer over the substrate;

depositing a layer of anti-reflective coating over the dielectric layer;

providing a layer of photoresist over the layer of anti-reflective coating;

patterning and defining the photoresist layer to provide a plurality of photoresist structures, wherein at least two adjacent photoresist structures provide a first distance;

anisotropically etching the layer of anti-reflective coating unmasked by the photoresist structures to remove only a portion of the anti-reflective coating layer;

etching the anti-reflective coating to completely remove the layer of anti-reflective coating unmasked by the photoresist structures; and etching the dielectric layer to form at least one trench between the at least two adjacent photoresist structures, wherein the first distance is substantially equal to a second distance defining an opening at the top of the trench.

2. The method as claimed in claim 1, wherein the dielectric layer is composed of silicon dioxide, silicon nitride, silicon oxynitride, or a combination thereof.

3. The method as claimed in claim 1, wherein the step of anisotropically etching comprises a step of using fluorocarbons as etchants.

4. The method as claimed in claim 3, wherein the fluorocarbon etchants include a mixture of $CF_4$ and $CHF_3$.

5. The method as claimed in claim 1, wherein the step of anisotropically etching is performed at a pressure of approximately 20 mTorr to 130 mTorr.

6. The method as claimed in claim 1, wherein the step of etching the layer of anti-reflective coating uses a mixture of nitrogen and hydrogen as etchants.

7. A method for forming a shallow trench isolation, comprising:

providing a semiconductor wafer;

providing a dielectric layer over the wafer;

depositing an anti-reflective coating layer over the dielectric layer;

providing a plurality of photoresist structures, wherein at least two adjacent photoresist structures provide a first distance;

etching the anti-reflective coating layer unmasked by the photoresist structures to remove less than the entire thickness of the anti-reflective coating layer;

further etching the anti-reflective coating with nitrogen and hydrogen etchants to remove only the anti-reflective coating unmasked by the photoresist structures; and etching the dielectric layer to form at least one trench between the at least two adjacent photoresist structures, wherein the first distance is substantially the same as a second distance defining an opening at the top of the trench.

8. The method as claimed in claim 7, wherein the dielectric layer comprises a layer of silicon dioxide and a layer of silicon nitride.

9. The method as claimed in claim 7, further comprising, etching the semiconductor wafer to form a plurality of shallow trenches, and filling the plurality of shallow trenches in the semiconductor wafer to form a plurality of shallow trench isolations.

10. A method of etching anti-reflective coatings in a semiconductor device, comprising:

providing a dielectric layer;

forming a plurality of vias in the dielectric layer;

depositing a layer of anti-reflective coating over the dielectric layer and in the plurality of vias;

providing a layer of photoresist over the layer of anti-reflective coating;

patterning and defining the photoresist layer to provide a plurality of photoresist structures, wherein at least two adjacent photoresist structures provide a first distance;

anisotropically etching the layer of anti-reflective coating unmasked by the photoresist structures to remove only a portion of the anti-reflective coating layer;

providing an etching having high etching selectivity between the anti-reflective coating layer and the dielectric layer to remove only the layer of anti-reflective coating unmasked by the photoresist structures; and etching the dielectric layer and at least one of the plurality of vias provided with the anti-reflective coating to form at least one trench between the at least two adjacent photoresist structures, wherein the first distance is substantially equal to a second distance defining an opening at the top of the trench.

11. The method as claimed in claim 10, wherein the dielectric layer is composed of silicon dioxide, silicon nitride, silicon oxynitride, or a combination thereof.

12. The method as claimed in claim 10, wherein the step of anisotropically etching comprises a step of using fluorocarbons as etchants.

13. The method as claimed in claim 12, wherein the fluorocarbon etchants include a mixture of $CF_4$ and $CHF_3$.

14. The method as claimed in claim 10, wherein the step of anisotropically etching is performed at a pressure of approximately 20 mTorr to 130 mTorr.

15. The method as claimed in claim 10, wherein the step of etching the layer of anti-reflective coating uses a mixture of nitrogen and hydrogen as etchants.

* * * * *